(12) United States Patent  
Cheng et al.

(10) Patent No.: US 8,928,096 B2
(45) Date of Patent: Jan. 6, 2015

(54) BURIED-CHANNEL FIELD-EFFECT TRANSISTORS

(75) Inventors: Kangguo Cheng, Schenectady, NY (US); Ali Khakifirooz, Mountain View, CA (US); Pranita Kulkarni, Slingerlands, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 13/474,949

(22) Filed: May 18, 2012

(65) Prior Publication Data

US 2013/0299906 A1 Nov. 14, 2013

Related U.S. Application Data

(63) Continuation of application No. 13/470,620, filed on May 14, 2012.

(51) Int. Cl.
*H01L 21/02* (2006.01)

(52) U.S. Cl.
USPC .... 257/410; 257/347; 257/310; 257/E21.632; 257/E21.403

(58) Field of Classification Search
USPC .......... 257/410, 347, 310, 216, 190, E21.632, 257/E21.403
See application file for complete search history.

(56) References Cited

U.S. PATENT DOCUMENTS

| 6,096,641 | A | 8/2000 | Kunikiyo |
| 6,376,293 | B1 | 4/2002 | Chapman |
| 6,583,015 | B2 | 6/2003 | Fitzgerald et al. |
| 6,730,576 | B1 * | 5/2004 | Wang et al. ............... 438/413 |
| 6,900,094 | B2 | 5/2005 | Hammond et al. |
| 6,933,518 | B2 * | 8/2005 | Braithwaite et al. ........... 257/18 |
| 7,355,235 | B2 | 4/2008 | Wang et al. |
| 7,507,629 | B2 * | 3/2009 | Lucovsky et al. ............. 438/261 |
| 7,585,716 | B2 * | 9/2009 | Cheng ......................... 438/183 |
| 7,629,603 | B2 | 12/2009 | Chui et al. |
| 7,719,062 | B2 | 5/2010 | Fischer et al. |
| 7,816,243 | B2 * | 10/2010 | Chuang et al. .............. 438/591 |
| 2001/0045604 | A1 * | 11/2001 | Oda et al. .................... 257/350 |
| 2004/0026765 | A1 * | 2/2004 | Currie et al. ................ 257/616 |
| 2005/0287759 | A1 * | 12/2005 | Wang et al. .................. 438/400 |
| 2006/0054937 | A1 * | 3/2006 | Lucovsky et al. ............. 257/213 |
| 2006/0138518 | A1 * | 6/2006 | Mutou et al. ................ 257/310 |
| 2006/0157733 | A1 * | 7/2006 | Lucovsky et al. ............. 257/192 |
| 2006/0163672 | A1 * | 7/2006 | Wang et al. .................. 257/396 |
| 2006/0172480 | A1 * | 8/2006 | Wang et al. .................. 438/199 |

(Continued)

OTHER PUBLICATIONS

Hu, G., et al. "Design Tradeoffs Between Surface and Buried-Channel FET's" IEEE Transactions on Electron Devices, vol. ED-32, No. 3. Mar. 1985. pp. 584-588.

(Continued)

*Primary Examiner* — Michael Shingleton
(74) *Attorney, Agent, or Firm* — Tutunjian & Bitetto, P.C.; Vazken Alexanian

(57) ABSTRACT

A buried-channel field-effect transistor includes a semiconductor layer formed on a substrate. The semiconductor layer includes doped source and drain regions and an undoped channel region. the transistor further includes a gate dielectric formed over the channel region and partially overlapping the source and drain regions; a gate formed over the gate dielectric; and a doped shielding layer between the gate dielectric and the semiconductor layer.

19 Claims, 8 Drawing Sheets

(56) References Cited

U.S. PATENT DOCUMENTS

| | | | | |
|---|---|---|---|---|
| 2007/0032009 | A1* | 2/2007 | Currie et al. | 438/199 |
| 2007/0215859 | A1* | 9/2007 | Clifton | 257/19 |
| 2008/0211025 | A1* | 9/2008 | Gottsche et al. | 257/351 |
| 2009/0039426 | A1* | 2/2009 | Cartier et al. | 257/344 |
| 2010/0035423 | A1* | 2/2010 | Clark | 438/585 |
| 2010/0109044 | A1* | 5/2010 | Tekleab et al. | 257/190 |
| 2010/0117152 | A1* | 5/2010 | Oh | 257/347 |
| 2010/0200937 | A1* | 8/2010 | Bedell et al. | 257/410 |
| 2010/0207214 | A1* | 8/2010 | Chuang et al. | 257/369 |
| 2010/0213477 | A1* | 8/2010 | Xu et al. | 257/94 |
| 2010/0237395 | A1* | 9/2010 | Clark | 257/300 |
| 2011/0079884 | A1* | 4/2011 | Basim et al. | 257/632 |
| 2011/0193181 | A1* | 8/2011 | Jung et al. | 257/411 |
| 2011/0198710 | A1* | 8/2011 | Lee et al. | 257/412 |
| 2011/0244641 | A1* | 10/2011 | Pan et al. | 438/270 |
| 2012/0112282 | A1* | 5/2012 | Lin | 257/347 |
| 2012/0139051 | A1* | 6/2012 | Ranade et al. | 257/368 |
| 2012/0181631 | A1* | 7/2012 | Bedell et al. | 257/410 |
| 2012/0299120 | A1* | 11/2012 | Braithwaite et al. | 257/401 |

OTHER PUBLICATIONS

Ostling, M., et al. "Challenes for 10 NM MOSFET Process Integration" Journal of Telecommunications and Information Technology. Feb. 2007. pp. 25-32.

Shang, H., et al. "Germanium Channel MOSFETS: Opportunities and Challenges" IBM Journal of Research and Development, vol. 50, Nos. 4-5. Jul. 2006. pp. 377-386.

* cited by examiner

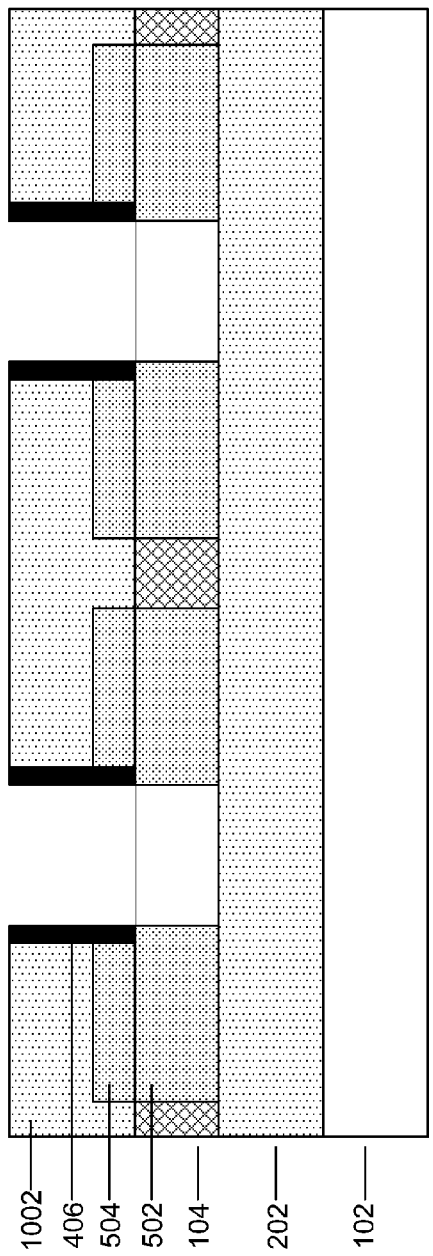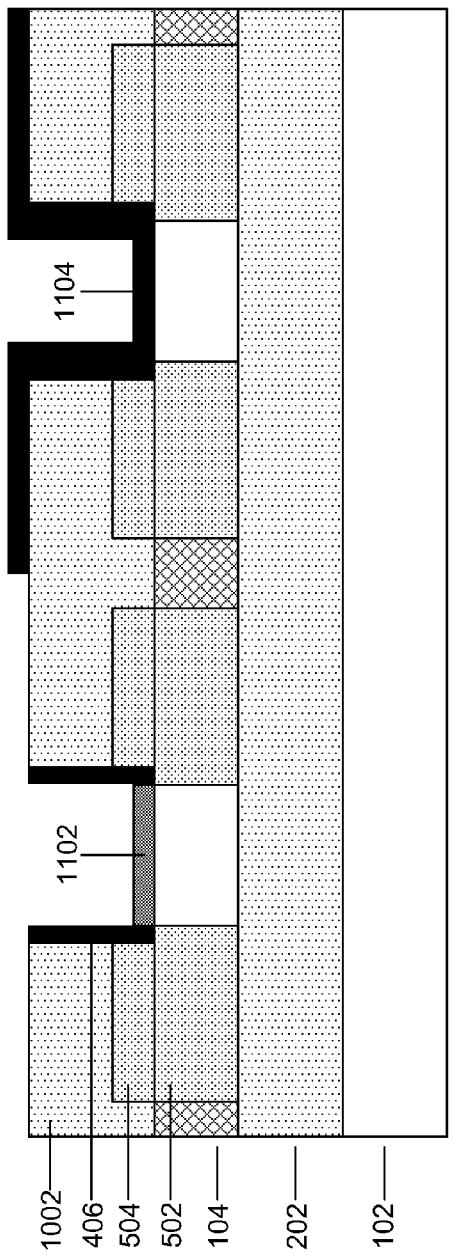

US 8,928,096 B2

BURIED-CHANNEL FIELD-EFFECT TRANSISTORS

RELATED APPLICATION INFORMATION

This application is a Continuation application of co-pending U.S. patent application Ser. No. 13/470,620 filed on May 14, 2012, incorporated herein by reference in its entirety.

BACKGROUND

1. Technical Field

The present invention relates to transistor design and, more particularly, to the design of buried-channel field-effect transistors.

2. Description of the Related Art

Metal gates and high-k dielectrics have been widely adopted in modern complementary-symmetry metal-oxide semiconductor (CMOS) technologies, due to their efficacy in creating very small transistors. In particular, dielectrics having a high dielectric constant k can achieve the same dielectric effect as traditional dielectrics, but at a much larger thickness. However, the use of high-k dielectrics also incurs a higher noise penalty than is present when using conventional silicon oxide gate dielectrics due to a higher density of interface traps. This high noise is problematic for applications which need low noise, such as when dealing with radio frequency signals.

SUMMARY

A method for forming a buried-channel field-effect transistor (FET) includes doping source and drain regions on a substrate with a dopant having a first type; forming a doped shielding layer on the substrate in a channel region having a second doping type opposite the first type to displace a conducting channel away from a gate-interface region; forming a gate dielectric over the doped shielding layer; and forming a gate on the gate dielectric.

A method for forming a buried-channel FET with a surface-channel FET includes doping a plurality of source and drain regions on a substrate with a dopant having a first type; forming a mask over at least one surface-channel region; forming a doped shielding layer on at least one buried-channel region of the substrate, wherein the doped shielding layer has a second doping type opposite the first type; removing the surface-channel region mask; forming a gate dielectric doped shielding layer; and forming a gate on the gate dielectric.

A buried-channel FET includes a semiconductor layer, having an undoped channel region and doped source and drain regions, formed on a substrate; a gate dielectric formed over the channel region and partially overlapping the source and drain regions; a gate formed over the gate dielectric; and a doped shielding layer between the gate dielectric and the semiconductor layer.

An integrated circuit includes a surface-channel FET and a buried-channel FET. The surface-channel FET includes a semiconductor layer, having an undoped channel region and doped source and drain regions, formed on a substrate; a gate dielectric formed on the channel region and partially overlapping the source and drain regions; and a gate formed over the gate dielectric. The buried-channel FET includes a semiconductor layer, having an undoped channel region and doped source and drain regions, formed on the substrate; a gate dielectric formed over the channel region and partially overlapping the source and drain regions; a gate formed over the gate dielectric; and a doped shielding layer between the gate dielectric and the semiconductor layer.

An integrated circuit includes a surface-channel FET and a buried-channel FET. The surface-channel FET includes a semiconductor layer, having an undoped channel region and raised doped source and drain regions, formed on a silicon-on-insulator substrate; a high-k gate dielectric located on the channel region and partially overlapping the source and drain regions; and a gate formed over the gate dielectric. The buried-channel FET includes a semiconductor layer having an undoped channel region and raised doped source and drain regions, formed on a silicon-on-insulator substrate; a high-k gate dielectric located on the channel region and partially overlapping the source and drain regions; a gate formed over the gate dielectric; and a doped shielding layer between the gate dielectric and the semiconductor layer having a dopant type opposite a dopant type of the doped source and drain regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 10 is a diagram of forming a dielectric fill around multiple FETs for a chip that includes buried-channel FETs and surface-channel FETs according to the present principles;

FIG. 11 is a diagram of masking a surface-channel region and forming a doped shielding layer in a buried-channel region according to the present principles;

DETAILED DESCRIPTION OF PREFERRED EMBODIMENTS

Figure 1:
FIG. 1 is a diagram of forming a substrate for a buried-channel field effect transistor (FET) according to the present principles.

The present principles provide processes and circuits for buried-channel field-effect transistors (FETs) using high-k dielectrics. These buried-channel FETs can be formed in the same process as surface-channel FETs, such that both types of circuit can be efficiently employed on a single chip. The buried channel structure displaces the conducting channel away from high density traps at the semiconductor-dielectric interface region thereby improving the noise performance of these devices for high-frequency applications.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an exemplary first step in a process flow for creating a buried channel FET is shown. Shallow trench isolation (STI) is used to create trenches 104 in a bulk substrate 102. The trenches 104 define a device area on the substrate 102 for the eventual formation of the FET. The substrate 102 may be formed from a semiconductor such as, e.g., silicon.

Figure 2:
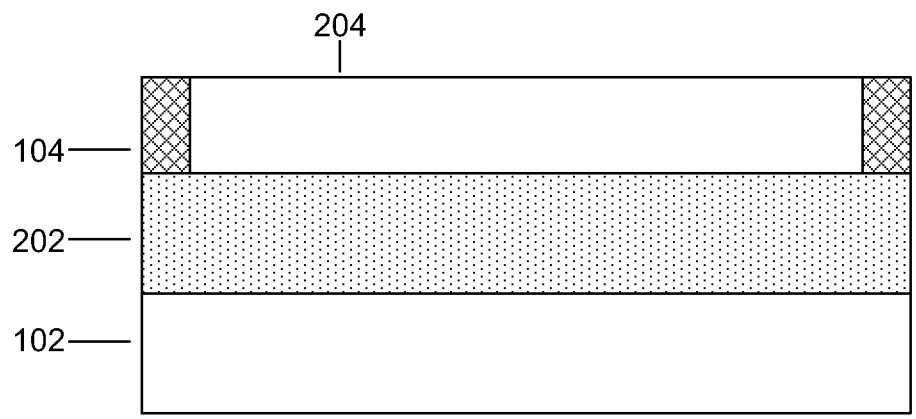
FIG. 2 is a diagram of forming an alternative substrate for a buried-channel FET according to the present principles.

Referring now to FIG. 2, an alternative first step in the process flow for a buried channel FET is shown. In this embodiment, a semiconductor-on-insulator (SOI) substrate is formed from a substrate 102, an insulator layer 202, and a semiconductor layer 204, stacked on top of one another as shown. As above, the substrate 102 may be formed from, e.g., silicon. The semiconductor layer 204 may be formed from any advantageous semiconductor, although silicon is specifically contemplated. The insulator layer 202 is formed from, e.g., an insulating dielectric such as silicon dioxide. In this embodiment, STI is used again to form trenches 104 which penetrate the semiconductor layer 204.

The rest of the process flow described below is identical for bulk substrate and SOI embodiments. In practical scenarios, thin SOI chips are preferred as they provide reduced parasitic capacitance and improved performance. As such, the following steps will only be shown as performed on an SOI embodiment.

Figure 3:
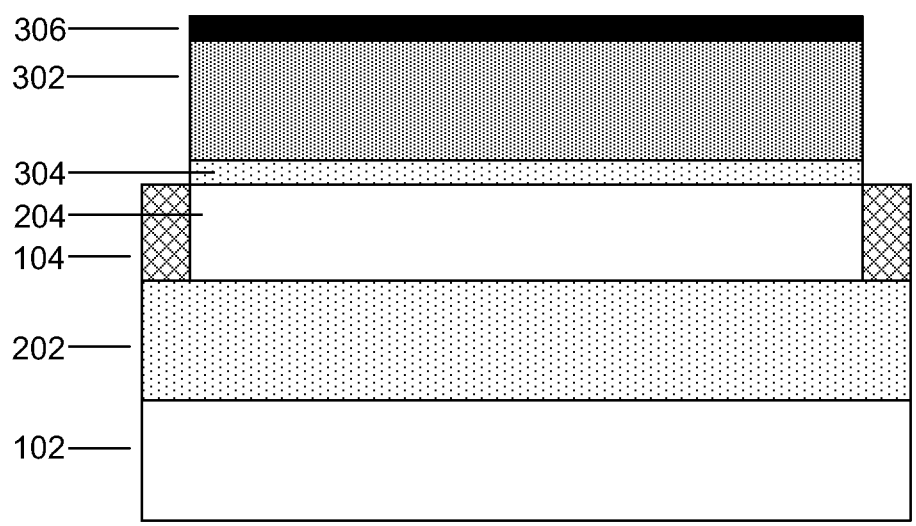
FIG. 3 is a diagram of forming dummy gate material for a buried-channel FET according to the present principles.

Referring now to FIG. 3, a dummy gate dielectric 304 is formed by depositing at least one dielectric layer formed from any appropriate dielectric including, for example, silicon dioxide. The dummy gate dielectric layer 304 protects the underlying semiconductor 204 when the dummy gate is later removed. A dummy gate material 302 is then deposited on the dummy gate dielectric layer 304. The dummy gate material 302 may be any advantageous material, although it is specifically contemplated that polysilicon may be used. A cap 306 is formed on the dummy gate material 302 over the dummy gate dielectric from, e.g., a nitride such as silicon nitride.

Figure 4:
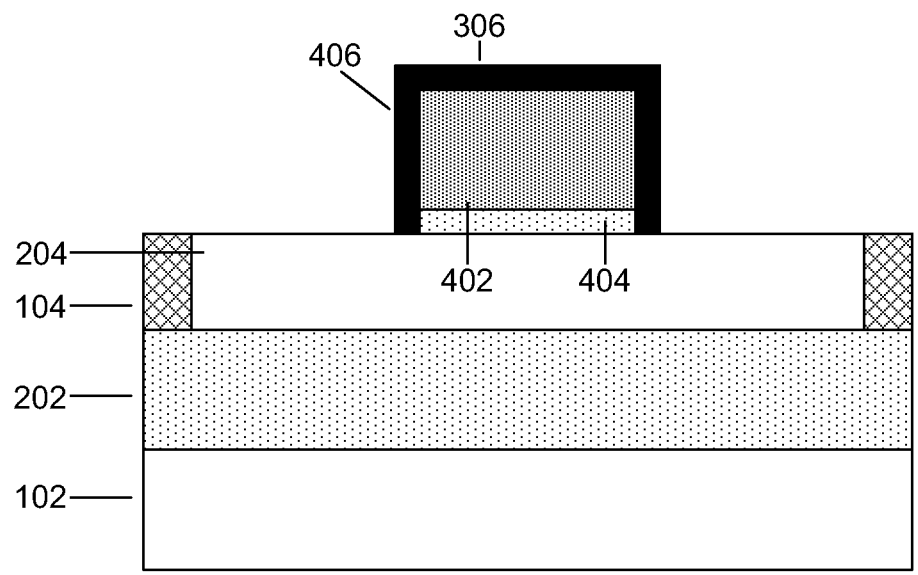
FIG. 4 is a diagram of finishing a dummy gate for a buried-channel FET according to the present principles.

Referring now to FIG. 4, the dummy gate material 302 and dielectric 304 not covered by the cap 306 is etched away using, e.g., an anisotropic reactive ion etch (RIE) process or any other suitable form of lithography. This produces dummy gate 402 and dummy gate dielectric 404. The spacers 406 are formed from, e.g., a nitride such as silicon nitride. The spacers 406 may be created by depositing spacer material and patterning the spacer material by an anisotropic etching process, such as RIE.

Figure 5:
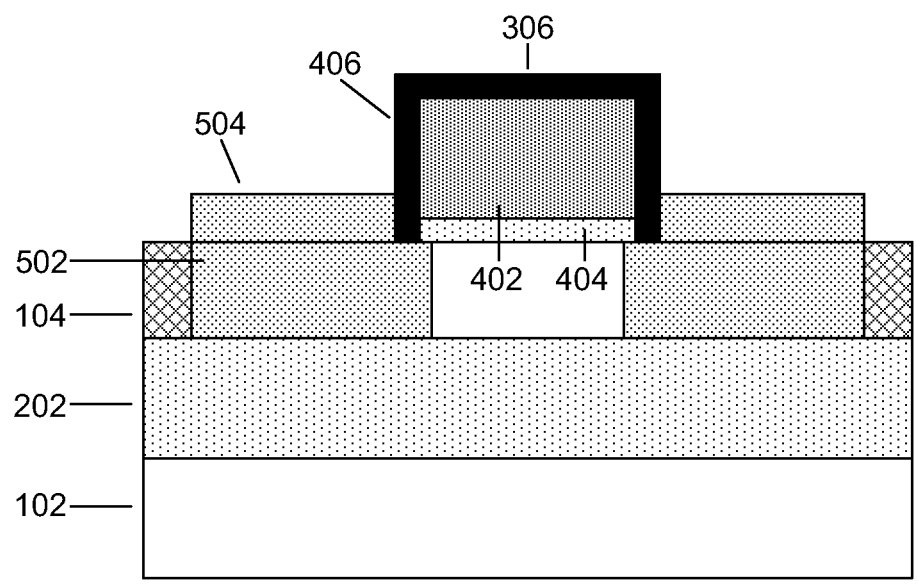
FIG. 5 is a diagram of forming doped source and drain regions for a buried-channel FET according to the present principles.

Referring now to FIG. 5, top of the semiconductor layer 204 may be doped with a first polarity of dopant. For example, the dopants may include an n-type dopant such as phosphorus and/or arsenic, but it is contemplated that any appropriate type of dopant may be used instead. Doping forms source and drain regions 502. Which region 502 will represent the source and which will represent the drain is which is not relevant to this process, but will be a consideration for a designer in determining how to connect the transistor to electrical terminals.

Additionally, an epitaxy layer 504 may be grown on the exposed surfaces of doped regions 502. Epitaxial growth includes the growth of a semiconductor material on a deposition surface, where the material being grown has the same crystalline characteristics as the semiconductor material of the deposition surface. When chemical reactants are controlled and system parameters are set correctly, depositing atoms arrive at the surface of the doped regions 502 with sufficient energy to move around on the surface and orient themselves to the crystal arrangement of the atoms of the surface of regions 502. Thus, an epitaxial film deposited on a {100} crystal surface will share the {100} orientation. If, on the other hand, the surface has an amorphous surface layer, which may result from implanting, depositing atoms will have no surface to align to, resulting in the formation of polysilicon instead of a single crystal silicon.

The epitaxy layer 504 may be in-situ doped or may be doped after growth by ion-implantation using the same dopant as in doped regions 502. The raised epitaxy layer 502 is used to form source drain junctions called Raised Source Drain (RSD) regions. The present principles are not limited to this type of source/drain design. Furthermore, the RSD areas 504 may be formed by a combination of in-situ doping or single/multiple ion implantations. A suitable annealing process including, e.g., junction annealing, laser annealing, flash annealing, spike annealing, or any appropriate combination of anneal processes, may be used to diffuse and activate the dopant in 502 and 504. The anneal may be used in both the SOI and bulk substrate embodiments, where dopant diffuses under spacers 406 and slightly under the gate/channel region. For example, the doped region 502 may overlap about 1-2 nm. To facilitate the overlap of the dopant with the channel, a tilted ion implantation process may be performed, whereby dopant is launched under the spacer region during implantation. The cap 306 protects the dummy gate material 402 from the epitaxy process. After epitaxy layers 504 have been grown, the cap 306 may be removed.

Figure 6:
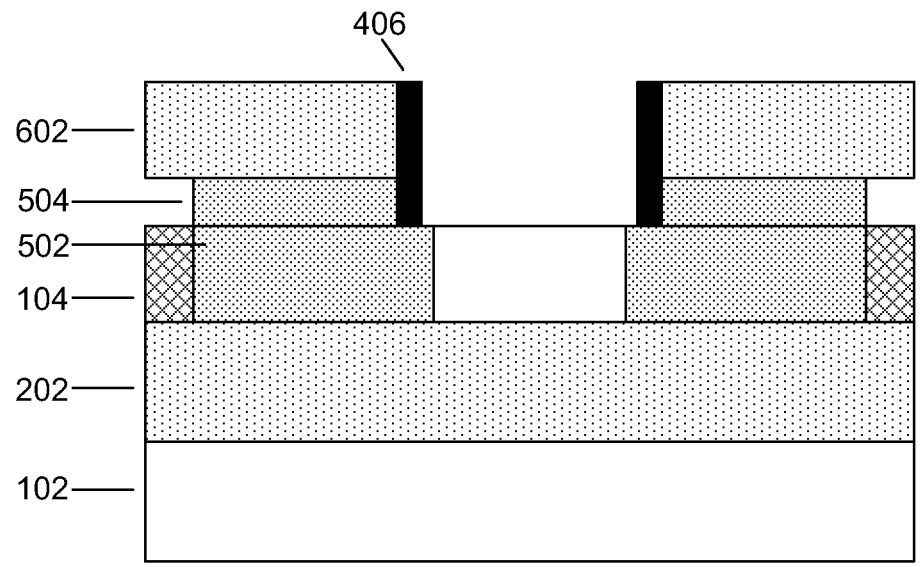
FIG. 6 is a diagram of forming a dielectric fill for a buried-channel FET according to the present principles.

Referring now to FIG. 6, a dielectric 602 is formed from, e.g., silicon dioxide. The dielectric 602 is planarized, stopping at the height of the dummy gate 402, and the dummy gate 402 is then removed along with the dummy gate dielectric 404 by an appropriate process that may include, e.g., RIE or a wet chemical etch. The dummy gate is removed in appropriate manner that does not damage the channel, top dielectric layer, and spacers.

Figure 7:
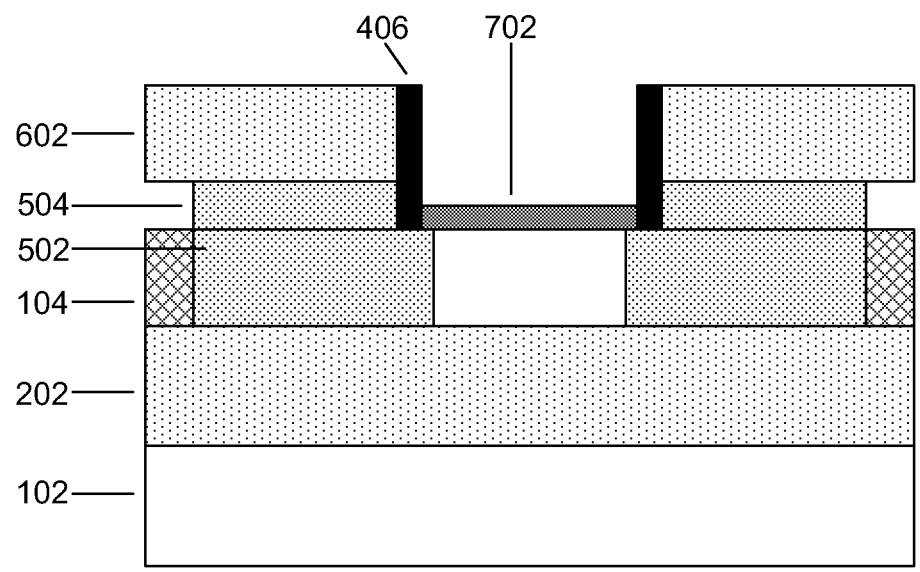
FIG. 7 is a diagram of forming a doped shielding layer for a buried-channel FET according to the present principles.

Referring now to FIG. 7, a doped layer 702 is formed. The doped layer 702 is of a type opposite that in the drain and source regions 502. So, for example, if the drain and source regions 502 were doped as n-type, the doped layer 702 is doped as p-type. The doped layer 702 may be epitaxially grown with in-situ doping and may be formed from, e.g., silicon-germanium with in-situ boron doping. However, it is contemplated that any appropriate semiconductor and dopant may be used.

Figure 8:
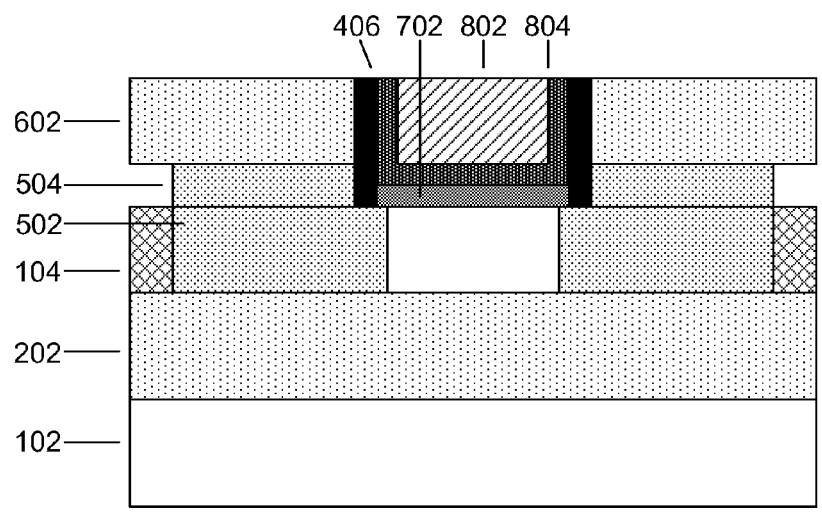
FIG. 8 is a diagram of forming a gate for a buried-channel FET according to the present principles.

Referring now to FIG. 8, a gate structure is formed. A dielectric layer 804 and gate 802 are formed over the doped layer 702. The dielectric layer 804 may be formed from a high-k dielectric, such as, e.g., hafnium silicate, zirconium silicate, hafnium dioxide or zirconium dioxide. The gate 802 may be formed from an appropriate metal or other conductor. In a surface-channel FET, the high-k dielectric would rest on the semiconductor layer 204, having a partial overlap with the source and drain regions 502. Because high-k gate dielectric interfaces are known to have a high density of interface traps, the surface-channel FET therefore suffers high noise due to the conducting channel being in close proximity with the high-k gate-dielectric interface. The present principles provide for displacement of the conducting channel away from the high-k interface with the use of doped layer 702, which prevents charge trapping at the gate interface and reduces noise in the transistor response. Using the present principles, buried-channel FETs such as that shown in FIG. 8 may be incorporated on the same chip as surface-channel FETs using a single chip-formation process.

Figure 9:
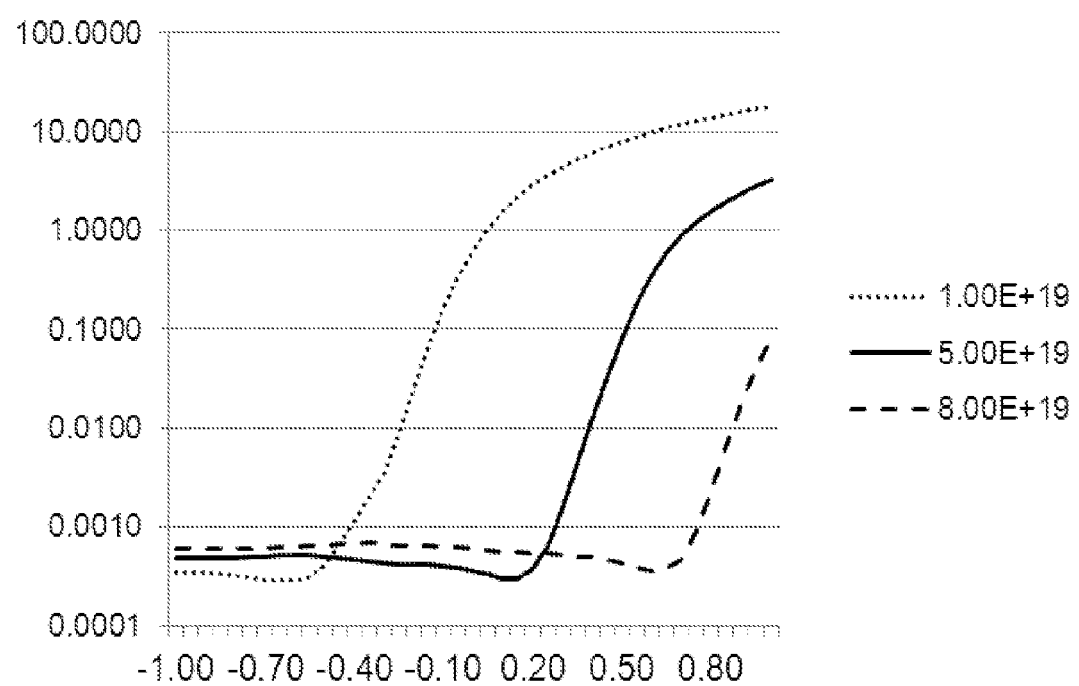
FIG. 9 is a graph illustrating the simulated current/voltage characteristics of buried-channel FETs with different doping concentrations for the doped shielding layer according to the present principles.

Referring now to FIG. 9, a graph showing the response curve of a buried-channel FET having n-type (1e20 phosphorus doped) source and drain contacts with a channel length of 40 nm and an inversion layer thickness of 1.2 nm is shown. Band-to-band and trap-assisted tunneling mechanisms were active in the simulation. The horizontal axis represents an applied gate voltage measured in Volts, ranging from −1 to 1 Volts, while the drain contact was maintained at 0.9V and all other contacts were grounded. The vertical axis shows drain current density in Amperes per centimeter on a logarithmic scale. Three curves are shown, each representing a different doping level in the doped layer 702. For the purposes of the simulation, the 702 layer comprised a SiGe compound semiconductor layer having 25% germanium content. The leftmost—curve a dotted line—shows a doped layer 702 having a boron concentration of $1 \cdot 10^{19}/cm^3$, the middle curve—a solid line—shows a doped layer 702 having a boron concentration of $5 \cdot 10^{19}/cm^3$, and the rightmost curve—a dashed line—shows a doped layer 702 having a boron concentration of $8 \cdot 10^{19}/cm^3$. It can be seen through these curves that the current level throughout the reverse gate-bias conditions remains fairly constant, with low noise irrespective of doping of the 702 layer. The expected threshold voltage shift with different boron doping in the 702 layer is also seen.

Referring now to FIG. 10, an embodiment of the present principles is shown that includes buried-channel FETs and surface-channel FETs on the same chip. It is still advantageous to do so, because surface-channel FETs are less susceptible to drain-induced barrier lowering and have better short-channel effect with higher transconductance than buried-channel FETs. By fabricating both chip features using a single process, substantial time and cost savings are achieved. The process for fabricating both types of device on a single chip is the same as shown above up through FIG. 6, as multiple dummy channels are formed on a single SOI chip. A common dielectric layer 1002 is filled in, leaving two channels open between spacers 504.

Referring now to FIG. 11, a masking step differentiates the buried-channel FET and the surface-channel FET. In one channel, a mask 1104 is laid down, covering spacers 406 and the underlying semiconductor layer 204. The mask 1104 may be formed from, e.g., a nitride such as silicon nitride.

In the other channel, as described above, a doped layer 1102 is formed. The doped layer 1102 is of a type opposite that in the drain and source regions 502. So, for example, if the drain and source regions 502 were doped as n-type, the doped layer 1102 is doped as p-type. The doped layer 1102 may be epitaxially grown with in-situ doping and may be formed from, e.g., silicon-germanium with in-situ boron doping. However, it is contemplated that any appropriate semiconductor and dopant may be used.

Figure 12:
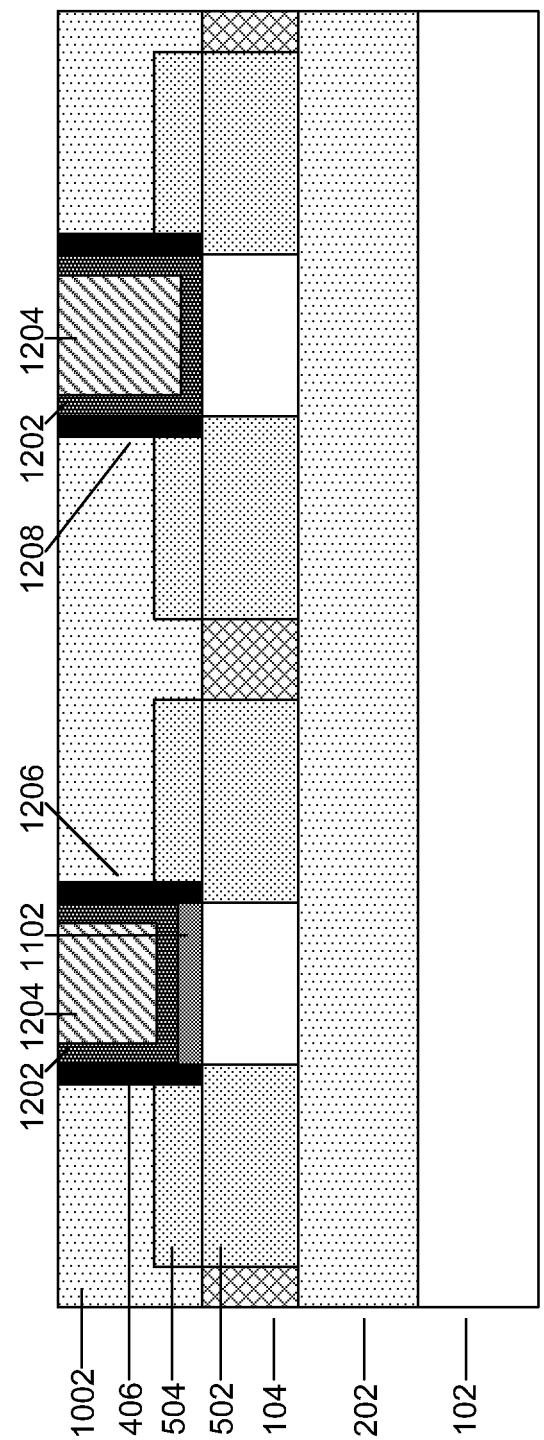
FIG. 12 is a diagram of forming gates in the surface-channel region and buried channel region to form surface-channel FETs and buried-channel FETs respectively according to the present principles.

Referring now to FIG. 12, gates are formed in the respective FETs. The mask 1104 is removed using a timed isotropic etch, such as, e.g., RIE or a wet chemical etch. The etch is timed such that the mask 1104 is removed without removing the spacers 406. The channels are then each provided with a dielectric layer 1202 and a gate material 1204. As above, the dielectric layer 1202 may be formed from a high-k dielectric, such as, e.g., hafnium silicate, zirconium silicate, hafnium dioxide, or zirconium dioxide, and the gate 1204 may be formed from an appropriate metal or other conductor. This produces one buried-channel FET 1206 and one surface-channel FET 1208 and allows for both kinds of transistor to be implemented on the same chip using the same fabrication process.

Figure 13:
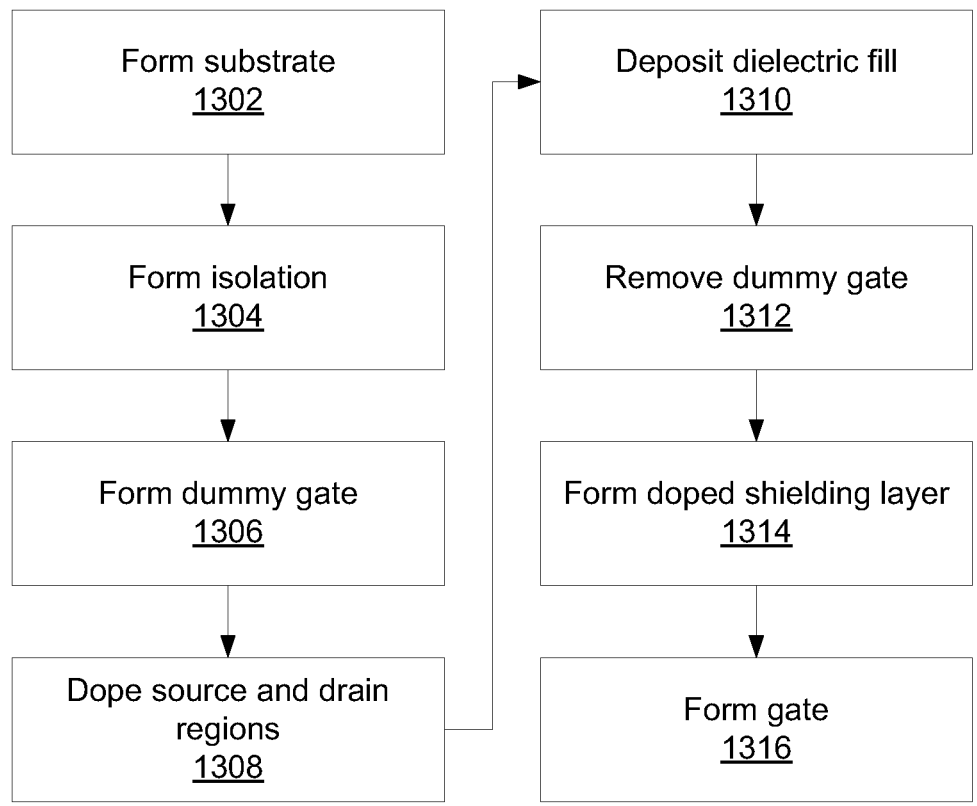
FIG. 13 is a block/flow diagram showing a process for creating a buried-channel FET according to the present principles.

Referring now to FIG. 13, a process for forming a buried-channel FET is shown. Block 1302 forms a substrate. As noted above, this substrate can be a simple bulk semiconductor substrate, such as in FIG. 1, an SOI substrate as in FIG. 2, or any other appropriate structure. Block 1304 forms isolation 104 using, e.g., STI. Any desired number of device regions can be created on a wafer using STI to physically separate one device from the next.

Block 1306 forms a dummy gate 402, including the formation of spacers 406 and dummy gate dielectric 404. It is specifically contemplated that the dummy gate 402 may be formed from polysilicon, though any appropriate material may be used. Block 1308 forms doped regions 502 using an n-type dopant such as phosphorus and/or arsenic, but it is contemplated that any appropriate type of dopant may be used instead. Optionally, raised source and drain regions 504 can be created around the spacers 406. Block 1310 fills in a dielectric 602 around the dummy gate 402. The dielectric 602 may be formed from any appropriate material including, e.g., silicon dioxide.

Block 1312 then removes the dummy gate 402 and dummy gate dielectric 404, using an anisotropic etch such as, e.g., RIE. Block 1314 then creates a doped shielding layer 702 in the channel left by the dummy gate. The doped layer 702 is of a type opposite that in the drain and source regions 502. So, for example, if the drain and source regions 502 were doped as n-type, the doped layer 702 is doped as p-type. The doped layer 702 may be epitaxially grown with in-situ doping and may be formed from, e.g., silicon-germanium with in-situ boron doping. However, it is contemplated that any appropriate semiconductor and dopant may be used. Block 1316 forms a high-k gate dielectric 804 and gate material 802 over the doped shielding layer 702 to form the buried-channel FET.

Figure 14:
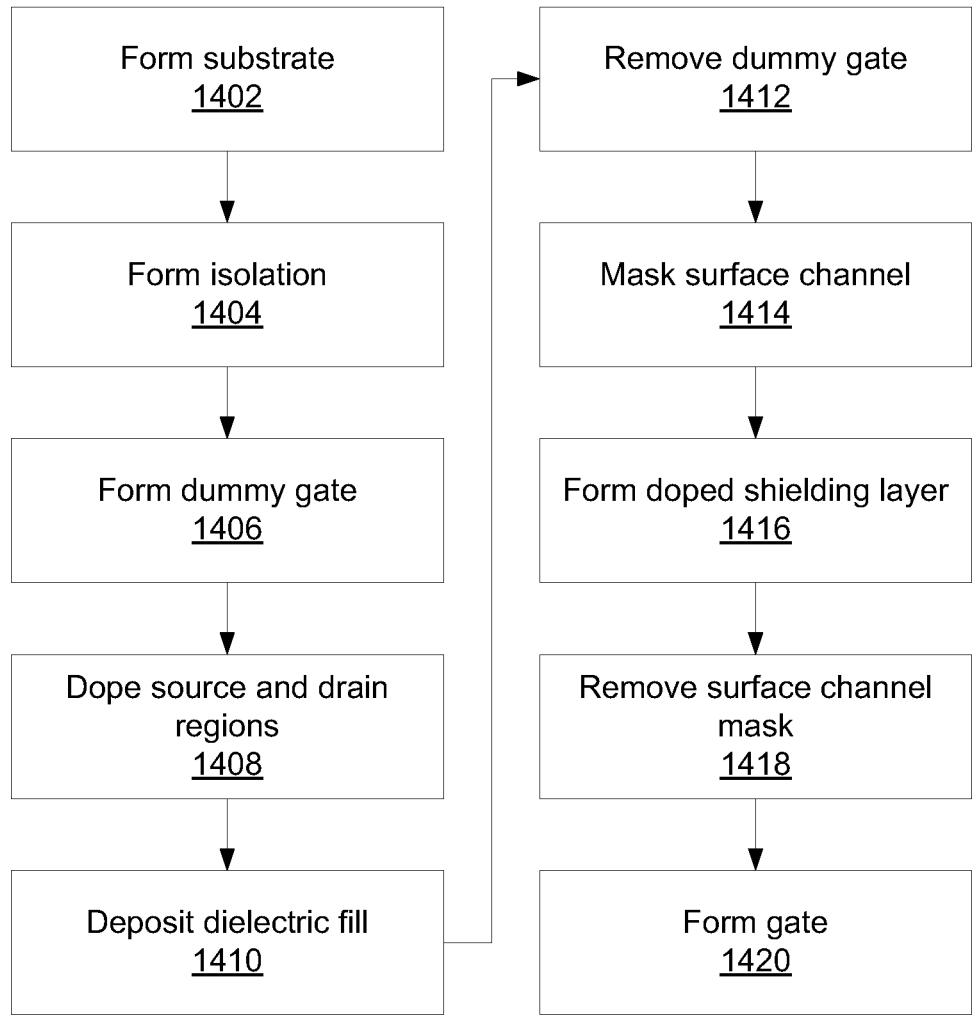
FIG. 14 is a block/flow diagram showing a process for creating a chip that includes buried-channel FETs and surface-channel FETs according to the present principles.

Referring now to FIG. 14, a process for forming a buried-channel FET on the same chip as a surface-channel FET is shown. Block 1402 forms a substrate. As noted above, this substrate can be a simple bulk semiconductor substrate, such as in FIG. 1, an SOI substrate as in FIG. 2, or any other appropriate structure. Block 1404 forms isolation 104 using, e.g., STI. Any desired number of device regions can be created on a wafer using STI to physically separate one device from the next. This includes at least two such device regions, to establish both a surface-channel FET and a buried-channel FET.

Block 1406 forms dummy gates 402 for each device, including the formation of spacers 406 and dummy gate dielectric 404. It is specifically contemplated that the dummy gate 402 may be formed from polysilicon, though any appropriate material may be used. Block 1408 forms doped regions 502 using an n-type dopant such as phosphorus and/or arsenic, but it is contemplated that any appropriate type of dopant may be used instead. Optionally, raised source and drain regions 504 can be created around the spacers 406. Block 1410 fills in a dielectric 1002 around the dummy gates 402. The dielectric 1002 may be formed from any appropriate material including, e.g., silicon dioxide.

Block 1412 then removes the dummy gates 402 and dummy gate dielectric 404, using an anisotropic etch such as, e.g., RIE. Block 1414 creates a mask 1104 over the surface channel. The mask 1104 may be formed from, e.g., a nitride such as silicon nitride. Block 1416 creates a doped shielding layer 1102 in the channel. The doped layer 1102 is of a type opposite that in the drain and source regions 502. So, for example, if the drain and source regions 502 were doped as n-type, the doped layer 1102 is doped as p-type. The doped layer 1102 may be epitaxially grown with in-situ doping and may be formed from, e.g., silicon-germanium with in-situ boron doping. However, it is contemplated that any appropriate semiconductor and dopant may be used.

Block 1418 removes the surface channel mask 1104 using any appropriate process. Block 1420 forms a high-k gate dielectric 1202 and gate material 1204 over the doped shielding layer 1102 to form the buried-channel FET 1206 and deposits the dielectric 1202 and gate material 1204 directly on the channel of surface-channel FET 1208.

Having described preferred embodiments of a system and method for forming buried-channel field-effect transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A buried-channel field-effect transistor (FET) comprising:
   a semiconductor layer formed on a substrate comprising:
      doped source and drain regions; and
      an undoped channel region;
   a gate dielectric formed over the channel region and partially overlapping the source and drain regions, wherein the gate dielectric consists of a single dielectric material;
   a gate formed over the gate dielectric, such that the gate dielectric has a 'u'-shaped cross-section and contacts three surfaces of the gate; and
   a doped shielding layer between the gate dielectric and the semiconductor layer, overlapping the source and drain regions.

2. The buried-channel FET of claim 1, wherein the dopant in the doped source and drain regions and the dopant in the doped shielding layer are of opposite type.

3. The buried-channel FET of claim 1, wherein the doped shielding layer is formed from in-situ boron-doped silicon germanium.

4. The buried-channel FET of claim 3, wherein the doped shielding layer includes a boron dopant concentration of about $5 \cdot 10^{19}/cm^3$.

5. The buried-channel FET of claim 1, further comprising raised source and drain regions on at least a portion of the source and drain regions.

6. The buried-channel FET of claim 1, further comprising:
   a nitride spacer outside the gate dielectric; and
   a dielectric layer over source and drain regions, outside the nitride spacer.

7. The buried-channel FET of claim 1, wherein the substrate is a bulk semiconductor.

8. The buried-channel FET of claim 1, wherein the substrate is a semiconductor-on-insulator substrate.

9. The buried-channel FET of claim 1, wherein the gate dielectric is a high-k dielectric.

10. An integrated circuit, comprising:
    a surface-channel field-effect transistor (FET) comprising:
       a semiconductor layer formed on a substrate comprising:
          doped source and drain regions; and
          an undoped channel region;
       a gate dielectric formed on the channel region and partially overlapping the source and drain regions, wherein the gate dielectric consists of a single dielectric material; and
       a gate formed over the gate dielectric, such that the gate dielectric has a 'u'-shaped cross section and contacts three surfaces of the gate; and a buried-channel FET comprising:
   a semiconductor layer formed on the substrate comprising:
     doped source and drain regions; and
     an undoped channel region;
   a gate dielectric formed over the channel region and partially overlapping the source and drain regions, wherein the gate dielectric consists of a single dielectric material;
   a gate formed over the gate dielectric, such that the gate dielectric has a 'u'-shaped cross-section and contacts three surfaces of the gate; and
   a doped shielding layer between the gate dielectric and the semiconductor layer, overlapping the source and drain regions.

11. The integrated circuit of claim 10, wherein the dopant in the doped source and drain regions and the dopant in the doped shielding layer are of opposite type.

12. The integrated circuit of claim 10, wherein the doped shielding layer is formed from in-situ boron-doped silicon germanium.

13. The integrated circuit of claim 12, wherein the doped shielding layer includes a boron dopant concentration of about $5 \cdot 10^{19}/cm^3$.

14. The integrated circuit of claim 10, further comprising raised source and drain regions on at least a portion of the source and drain regions of the respective FETs.

15. The integrated circuit of claim 10, further comprising:
   a nitride spacer outside the gate dielectrics of the respective FETs; and
   a dielectric layer over source and drain regions, outside the nitride spacer, that fills a space between the respective FETs.

16. The integrated circuit of claim 10, wherein the substrate is a bulk semiconductor.

17. The integrated circuit of claim 10, wherein the substrate is a semiconductor-on-insulator substrate.

18. The integrated circuit of claim 10, wherein the gate dielectric is a high-k dielectric.

19. An integrated circuit, comprising:
   a surface-channel field-effect transistor (FET) comprising:
     a semiconductor layer formed on a semiconductor-on insulator substrate comprising:
       raised doped source and drain regions; and
       an undoped channel region;
     a high-k gate dielectric located on the channel region and partially overlapping the source and drain regions, wherein the gate dielectric consists of a single dielectric material; and
     a gate formed over the gate dielectric, such that the gate dielectric has a 'u'-shaped cross-section and contacts three surfaces of the gate; and
   a buried-channel FET comprising:
     a semiconductor layer formed on the silicon-on-insulator substrate comprising:
       raised doped source and drain regions; and
       an undoped channel region;
     a high-k gate dielectric located on the channel region and partially overlapping the source and drain regions, wherein the gate dielectric consists of a single dielectric material;
     a gate formed over the gate dielectric, such that the gate dielectric has a 'u'-shaped cross-section and contacts three surfaces of the gate; and
     a doped shielding layer between the gate dielectric and the semiconductor layer having a dopant type opposite a dopant type of the doped source and drain regions, overlapping the source and drain regions.

* * * * *